US012456986B2

(12) United States Patent
Zhong

(10) Patent No.: US 12,456,986 B2
(45) Date of Patent: Oct. 28, 2025

(54) ANALOG-TO-DIGITAL CONVERTER WITH BUILT-IN CHARGE-BASED CAPACITANCE MEASUREMENTS

(71) Applicant: QUALCOMM Incorporated, San Diego, CA (US)

(72) Inventor: Xiaopeng Zhong, Seattle, WA (US)

(73) Assignee: QUALCOMM INCORPORATED, San Diego, CA (US)

( * ) Notice: Subject to any disclaimer, the term of this patent is extended or adjusted under 35 U.S.C. 154(b) by 216 days.

(21) Appl. No.: 18/537,559

(22) Filed: Dec. 12, 2023

(65) Prior Publication Data

US 2025/0192793 A1 Jun. 12, 2025

(51) Int. Cl.
*H03M 1/10* (2006.01)
*H03M 1/46* (2006.01)

(52) U.S. Cl.
CPC ....... *H03M 1/1071* (2013.01); *H03M 1/1095* (2013.01); *H03M 1/468* (2013.01)

(58) Field of Classification Search
CPC ... H03M 1/1071; H03M 1/1095; H03M 1/468
USPC .................................................. 341/155, 172
See application file for complete search history.

(56) References Cited

U.S. PATENT DOCUMENTS

| | | | |
|---|---|---|---|
| 5,648,717 | A | 7/1997 | Uskali |
| 6,054,861 | A | 4/2000 | Takahashi |
| 9,086,450 | B2 | 7/2015 | Liu et al. |
| 10,236,901 | B1 | 3/2019 | Neto |
| 10,601,436 | B2 * | 3/2020 | Hiraide ................... H03M 1/38 |
| 10,958,282 | B2 * | 3/2021 | Olieman ............... H03M 1/403 |
| 2018/0198460 | A1 | 7/2018 | Bogner et al. |

FOREIGN PATENT DOCUMENTS

CN 116192148 A 5/2023

OTHER PUBLICATIONS

Chang H-W., et al., "A Novel Simple CBCM Method Free From Charge Injection-Induced Errors", IEEE Electron Device Letters, USA, vol. 25, No. 5, May 1, 2004, pp. 262-264, XP011112203, Section I and II, figure 1.
Hill S., et al., "An Engineer's Guide to Current Sensing", Texas Instruments, Jan. 1, 2023, 64 Pages, XP093255245, p. 2.
International Search Report and Written Opinion—PCT/US2024/057800—ISA/EPO—Mar. 20, 2025.

* cited by examiner

*Primary Examiner* — Khai M Nguyen
(74) *Attorney, Agent, or Firm* — Loza & Loza, LLP

(57) ABSTRACT

An ADC with built-in charge-based capacitance measurements is described. An example includes a plurality of capacitors coupled in parallel to an input voltage at a common node, a plurality of drivers each coupled to a respective capacitor opposite the common node, a first switch coupled to the common node to couple the common node to a ground in response to a second clock signal from a timing generator, a second switch coupled to the common node to couple the common node to a reference voltage in response to a third clock signal from the timing generator, a successive logic circuit configured to control each driver to alternately drive the second clock signal to a selected capacitor or to couple the selected capacitor to ground, and measurement logic including a current sensor to measure a current through the common node and configured to determine a capacitance of the selected capacitor.

20 Claims, 8 Drawing Sheets

500

ANALOG-TO-DIGITAL CONVERTER WITH BUILT-IN CHARGE-BASED CAPACITANCE MEASUREMENTS

TECHNICAL FIELD

Aspects of the present disclosure relate generally to charge-based capacitor measurements and, in particular, to measurements of capacitors in circuits with multiple parallel capacitors, e.g., an analog-to-digital converter.

BACKGROUND

Integrated circuit designers have found many ways to substitute transistors or components similar to transistors for many other electronic circuit components. Nevertheless, many circuits still require capacitors which are used throughout modern silicon devices. Capacitors are especially important to radio frequency interfaces and analog interfaces, whether an analog-to-digital converter (ADC), or a digital-to-analog converter (DAC), especially a capacitor digital-to-analog converter (CDAC). Some such capacitors are formed in the semiconductor substrate using conductive areas, e.g., doped silicon, isolated by dielectric areas, e.g., silicon-based oxides.

Integrated circuit designers are able to design the capacitors by relying on past experience, modeling software, and post-layout extraction to estimate the capacitor performance. In some circuits, the physical parameters of a capacitor can determine the performance of the circuit and render it useful or useless. Test wafers may be produced for a particular integrated circuit. This allows the integrated circuit to be operated as a whole with expected input and output. The capacitor design may then be modified to improve the results for another test run.

BRIEF SUMMARY

The following presents a summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

An ADC with built-in charge-based capacitance measurements is described. An example includes a timing generator configured to receive a first clock signal, a plurality of capacitors coupled in parallel to an input voltage at a common node, a plurality of drivers each coupled to a respective capacitor opposite the common node, each driver coupled to a second clock signal to drive the capacitor with the second clock signal, a first switch coupled to the common node and configured to couple the common node to a ground in response to the second clock signal from the timing generator, a second switch coupled to the common node and configured to couple the common node to a reference voltage in response to a third clock signal from the timing generator, a successive logic circuit configured to control each driver to alternately drive the second clock signal to a selected capacitor or to couple the selected capacitor to ground, and measurement logic including a current sensor to measure a current through the common node and configured to determine a capacitance of the selected capacitor of the plurality of capacitors.

In another example, an analog-to-digital converter (ADC) includes a timing generator configured to receive a first clock signal, an n voltage input port, a first plurality of capacitors coupled in parallel to the n voltage input port at a first common node, a plurality of drivers each coupled to a respective capacitor opposite the first common node, each driver coupled to a second clock signal to drive the capacitor with the second clock signal, a p voltage input port, a second plurality of capacitors coupled in parallel to the p voltage input port at a second common node, a second plurality of drivers each coupled to a respective capacitor of the second plurality of capacitors opposite the second common node, each driver coupled to a third clock signal to drive the respective capacitor with the third clock signal, a first switch coupled to the first common node and configured to couple the first common node to a ground in response to the second clock signal from the timing generator, a second switch coupled to the first common node and configured to couple the first common node to a reference voltage in response to a third clock signal from the timing generator, a successive logic circuit configured to control each driver to alternately drive the second clock signal to a selected capacitor or to couple the selected capacitor to ground, and measurement logic including a current sensor to measure a current through the first common node and configured to determine a capacitance of the selected capacitor of the first plurality of capacitors.

In another example, a method includes driving a plurality of capacitors of an analog-to-digital converter (ADC) with a first clock signal through a plurality of drivers each coupled to a respective capacitor, coupling a common node to a ground in response to a second clock signal, the common node coupled to each of the plurality of capacitors opposite the respective driver, coupling the common node to a reference voltage in response to a third clock signal, controlling each driver to alternately drive the first clock signal to a selected capacitor or to couple the selected capacitor to ground, and measuring a current through the common node to determine a capacitance of the selected capacitor of the plurality of capacitors.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, these concepts may be practiced without these specific details. In some instances, well-known structures and components are shown in block diagram form in order to avoid obscuring such concepts.

When capacitors on an integrated circuit are very small, small structural differences can cause a large proportional change in the values of the capacitors. Yet silicon verification of a CDAC design is difficult as the capacitor is very small and there is not always a direct way to access and measure it inside an ADC. Since very small features are affected by other nearby features, it may not be possible to accurately characterize a capacitor by fabricating a test circuit other than a perfect copy of the entire system. Techniques and structures described herein may be used to characterize a set of capacitors prior to mass production and also to test capacitors that are in service in mass produced systems. The test may be used for calibration, adjustment, or verification.

A SAR (Successive-Approximation-Register) ADC is widely used in a variety of integrated circuit chips, chipsets, and chiplets. A SAR ADC contains multiple CDACs (Capacitor Digital-to-Analog Converters) which are an important part of the accuracy of the SAR ADC. With the multiple CDACs, the accuracy of each CDAC, especially any mismatch among DAC units, directly impacts the overall ADC performance. DAC is used herein to refer simultaneously to a CDAC and to other types of DACs that may also benefit from capacitor testing.

Figure 1:
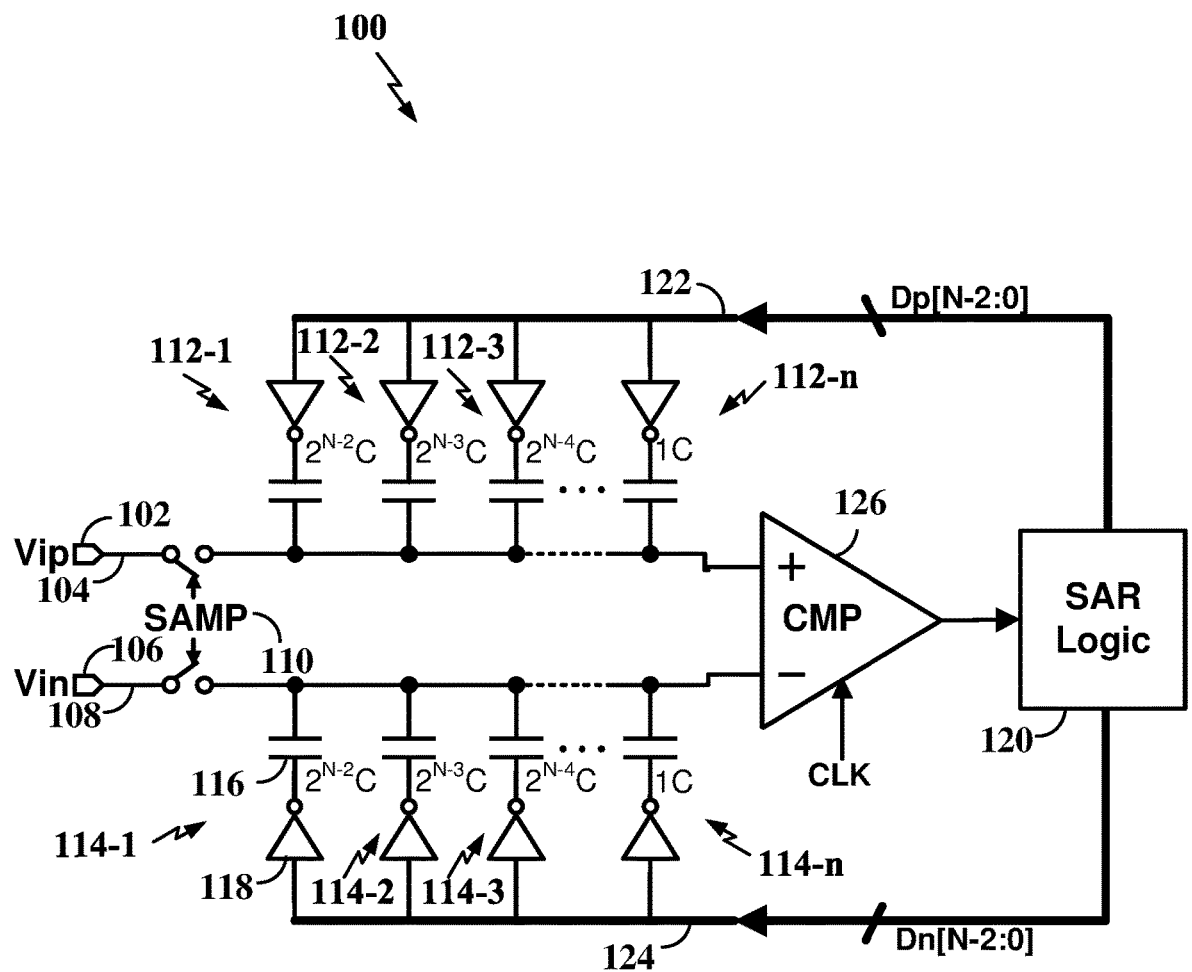
FIG. 1 is a circuit diagram of an example SAR ADC 100.

FIG. 1 is a circuit diagram of an example SAR ADC 100. An input signal has a first p voltage input port 102 to receive a p side or positive pole of the voltage on a p line 104 and an n voltage input port 106 to receive an n side or negative pole of the voltage on an n line 108. The voltage across the p line 104 and the n line 108 is sampled at a switch 110 that determines the sampling frequency for a sample and hold function across the p line 104 and the n line 108. The p line 104 is coupled to a positive pole of a Comparator 126 and the n line 108 is coupled to the negative pole of the Comparator 126. The Comparator compares the relative potential on each line and sends an output signal to SAR logic 120 which generates the converted digital representation of the input analog voltage. The SAR logic 120 is an example of a successive logic circuit.

The N-bit SAR ADC has a series of N−1 upper DAC units 112-1, 112-2, 112-3, . . . 112-$n$, each coupled in parallel to the p line 104, and a series of N−1 lower DAC units 114-1, 114-2, 114-3, . . . 114-$n$ each coupled in parallel to the n line 108. Each DAC unit includes a capacitor 116 and a buffer, e.g. an inverter 118, coupled to the capacitor opposite the respective p line 104 or n line 108 to control the operation of the capacitor to which it is coupled. Each corresponding upper and lower DAC unit pair has a different capacitance and forms an approximation unit. As shown, the n−1th upper DAC unit 112-$n$ and the n−1th lower DAC unit 114-$n$ have the same capacitance, expressed as 1C where 1 is a factor of 1 and C is a unit capacitance value. The first upper DAC unit 112-1 and the first lower DAC unit 114-1 have the same capacitance, expressed as $2^{N-2}C$, where $2^{N-2}$ is a factor for the same unit capacitance value C. The approximation unit generates the voltage in succession to provide successive approximations. The inverter 118 is coupled to the SAR logic 120 that controls the operation of the inverter 118 to drive a current into the capacitor 116 or to drain the capacitor 116. The SAR logic 120 has a p control line 122 to independently control each of the upper DAC units 112-1, 112-2, 112-3, . . . 112-$n$ and a lower control line 124 to independently control each of the lower DAC units 114-1, 114-2, 114-3 . . . 114-$n$. In some examples, there is only the upper DAC units or the lower DAC units. In some examples, both upper and lower DAC units are used but at different times. In some examples, the p-side, coupled to the p line 104, or the n-side, coupled to the n line 108 is switched on based on a result from the comparator 126. The two sides should provide about the same result except that the result is positive on the p side and negative on the n side.

In operation, opposite and equivalent upper and lower DAC units are engaged to sample the voltage across the p line 104 and the n line 108, respectively, by activating the respective capacitors, through the respective drivers, and conducting the result to the Comparator 126. This is repeated for each respective pair of upper and lower DAC units to obtain a measurement for each DAC unit pair. Each DAC unit pair has a different capacitance to sense the voltage at different levels and create an n-bit voltage value at the Comparator. The Comparator 126 sends the relative voltage for each DAC unit to the SAR logic 120 that determines the digital voltage value and also controls the operation of the SAR ADC 100.

The SAR ADC is shown as an example of an ADC that operates using capacitors and for which the accuracy of the capacitors is important both relative to each other and relative to external physical constants. Aspects of the invention may be applied to capacitors of many other types of ADC's and other circuits other than ADC's. A SAR ADC may also be configured for a single voltage relative to a reference or ground voltage. Other control, sample, and measurement circuits may be used other than that shown here. The SAR ADC 100 may be configured with 8 or 10 pairs of DAC units or with any other number. The pairs of DAC units may be operated individually or in different combinations to obtain a greater number of different capacitance values.

Figure 2:
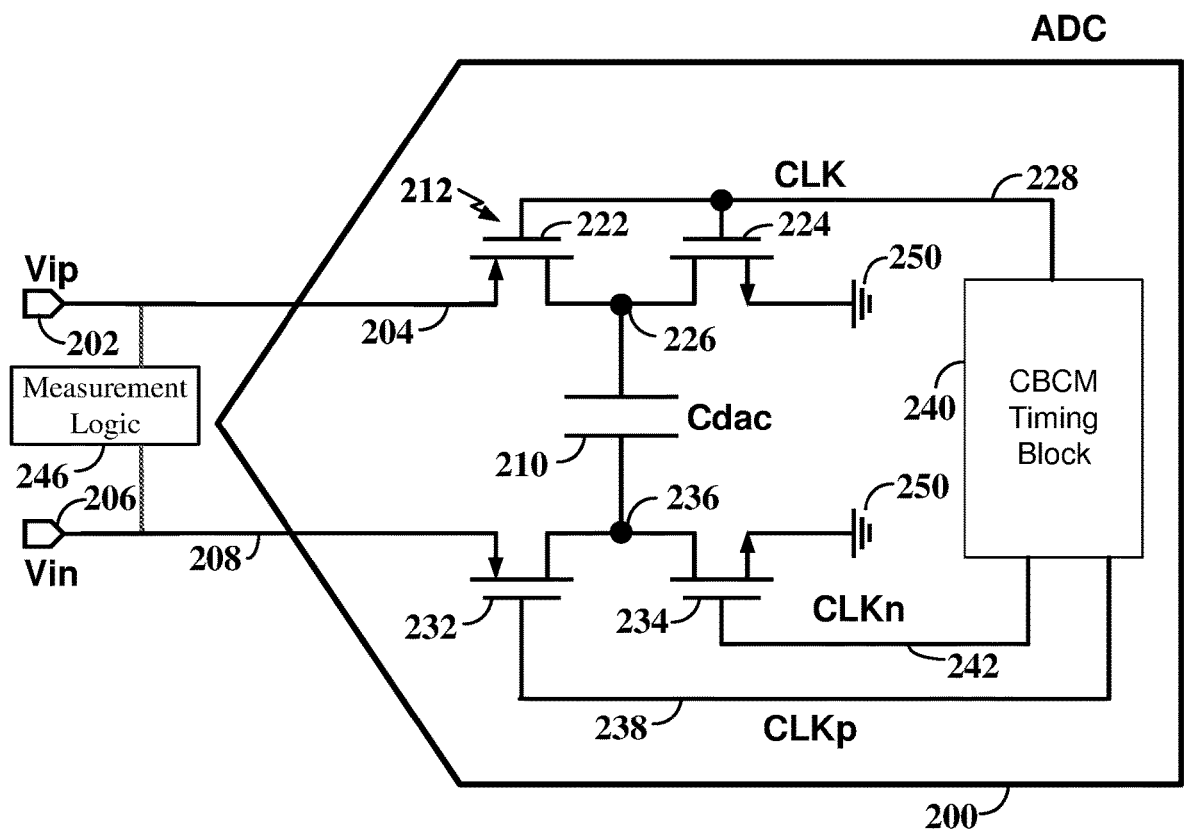
FIG. 2 is a circuit diagram of a test circuit for a capacitor of an integrated circuit, in accordance with aspects of the disclosure.

FIG. 2 is a circuit diagram of a test circuit 200 for a capacitor of an integrated circuit, e.g., a SAR ADC. The circuit is in the form of an ADC with a built-in CBCM (Charge-Based Capacitance Measurement) timing block. An input signal has a first p voltage input port 202 to receive a p side or positive pole of the voltage for a p line 204 and an n voltage input port 206 to receive an n side or negative pole of the voltage for an n line 208. The p line 204 and n line 208 may be the same lines that are the primary signal input lines for an ADC, e.g., the p line 104 and n line 108. The p line is coupled through a top pMOS (p-type metal oxide semiconductor) transistor 212 from the source to the drain to a bottom node 226. The bottom node 226 is also coupled to the drain of a top nMOS (n-type metal oxide semiconductor) transistor 224 and to the bottom side of a capacitor labeled as CDAC 210. The n line 208 is coupled through a bottom pMOS transistor 232 from the source to the drain to a node 236 that is also coupled to the drain of a bottom nMOS transistor and to the top side of the CDAC 210. The CDAC 210 represents a capacitor of an ADC or other integrated circuit that is to be measured.

The bottom node 226 is further coupled to a ground 250 through the top nMOS transistor 224 from the drain to the source. The bottom node 236 is further coupled to the ground 250 through a bottom nMOS transistor 234 from the drain to the source. The gates of the top pMOS transistor 222 and the top nMOS transistor 224 are both coupled to a clock line 228. The gate of the bottom pMOS transistor 232 is coupled to a clock p line 238 and the gate of the bottom nMOS transistor 234 is coupled to a clock n line 242. The clock line 228, e.g., the first clock line, clock n line 242, e.g. the second clock line, and clock p line 238, e.g., the third clock line, are all generated by and controlled by a CBCM timing block.

The top pMOS transistor 222 and the top r 224 form a buffer and a driver for the CDAC 210. During a clock pulse, the potential from the p line 204 is applied to the bottom plate of the CDAC 210. The bottom pMOS transistor 232 charges the CDAC 210 when the clock p line 238 is low and the clock n line 242 is low. The bottom nMOS transistor 234 discharges the CDAC 210 when the clock n line 242 is high and the clock p line 238 is high. This configuration allows the CDAC to be charged to the voltage across the p line 204 and the n line 208 and then for the charge to be drained, depending on the status of the gate signals at each of the transistors. Each such change in charge causes a flow of current from either the p line 204 or the n line 208. The voltage should be about the same for the p line 204 and the n line 208, i.e., Vref. The absolute current going into the N voltage input port 202 is measured by the measurement logic 246. It's not required to connect the top plate of Cdac and associated circuit to Vin and the bottom plate of Cdac with associated circuit to Vip. Vin and Vip can be swapped. This is shown in more detail as the measurement logic 440 of FIG. 4 and 640 of FIG. 6. The measurement logic includes a current sensor to measure a current through the common node at different states of the parallel capacitor circuit. The measurement logic or another higher layer external component may determine capacitance of one or more of the capacitors using the current measurements. The resulting capacitance measurement may be determined by the CBCM logic 240.

The SAR ADC or any parallel capacitor circuit and the test circuit may be formed in any suitable integrated circuit die which may be considered to be any integrated circuit that is formed on and then cut, removed, or otherwise extracted from a wafer. The wafer may be silicon, glass, gallium nitride, or any other suitable material for forming integrated circuits. The parallel capacitor circuit and the test circuit may be integrated into a system on a chip (SoC) which may include one or more chips or chiplets in a single package. The SoC may have a processor, and one or more chiplets coupled to the processor. The structure of the SoC may be adapted to suit different uses and may include all types of current packaging options from different fabricators and fabrication processes.

Figure 3:
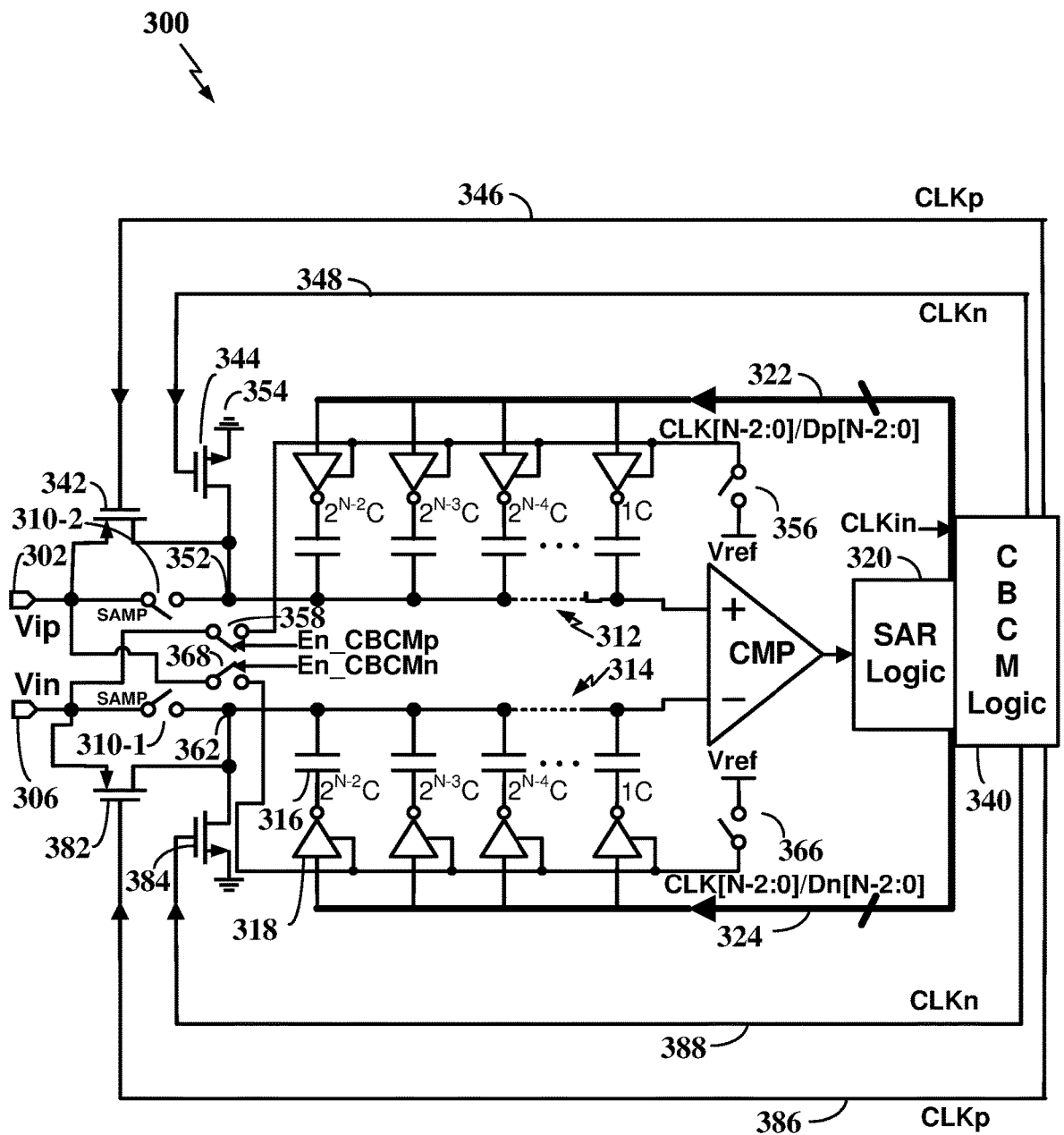
FIG. 3 is a circuit diagram of a SAR ADC with a CBCM, in accordance with aspects of the disclosure.

FIG. 3 is a circuit diagram of a SAR ADC with a CBCM 300 to indicate an example of how a test circuit, e.g., the test circuit 200 of FIG. 2, may be integrated into a capacitor circuit, e.g., the SAR ADC 100 of FIG. 1. An input signal has a first p voltage input port 302 to receive a p side signal of a voltage that is coupled to successive upper DAC units 312. A second n voltage input port 306 receives a negative pole n side signal of the voltage that is coupled to successive lower DAC units 314. The voltage at the p voltage input port 302 is sampled at a switch 310-2 and the voltage at the n voltage input port 306 is sampled at a switch 310-1. The switches 310-1, 310-2 determine the sampling frequency for a sample and hold function. The measurements of each pair of DAC units are taken in succession to produce a multiple measurements to a Comparator 326 as described above. The Comparator 326 output is coupled to SAR logic 320 that generates a multiple-bit representation of the analog voltage at the p voltage input port 302 and the n voltage input port 306. The SAR logic is an example of a successive logic circuit to control the operation of each CDAC, e.g., to measure the voltage in succession. These SAR ADC portions may be similar to or the same as the SAR ADC described with reference to FIG. 1.

Each DAC unit 312, 314 includes at least a capacitor 316 coupled to a voltage line in parallel with the other DAC units and an inverter 318 coupled to the capacitor opposite the voltage line. While inverters 318 are shown, buffers or another switching control circuit may be used as a driver to control the respective DAC unit. The inverters 318 are controlled by clock lines 322, 324 from the SAR logic to operate in succession as a SAR ADC.

A test circuit is built-in or integrated with the SAR ADC by adding a few lines and transistors coupled to CBCM logic 340 as described herein. The p line from the p voltage input port 302 is coupled to a top side common node 352 that is coupled to the top side of each of the upper DAC units 312. If the switch 310-2 is open, as shown, then the p voltage input port 302 is coupled to the top side common node 352 through a top pMOS transistor 342 from source to drain. The top side common node 352 is also coupled to ground 354 through a top nMOS transistor 344. The gate of the top pMOS transistor is controlled by a clock p line 346 from the CBCM logic 340 and the gate of the top nMOS transistor is controlled by a clock n line 348 from the CBCM logic 340. The operation may be the same as for the bottom pMOS transistor 232 and the bottom nMOS transistor 234 of FIG. 2. The bottom side of the capacitors of the upper DAC units 312 are coupled to inverters as drivers which may operate in the same way or a similar way as described for the top pMOS transistor 222 and the top nMOS transistor 224 of FIG. 2. By using a top reference voltage switch 356, each inverter may be coupled to a reference voltage. By using an n line switch 358, each inverter may be coupled to the n voltage input port 306. With top reference voltage switch 356 closed and the n line switch 358 open, the inverters of the upper DAC units 312 are powered by the internal reference voltage Vref through the top reference voltage switch 356 for normal ADC operation. For CBCM operation, the n line switch 358 is closed while the top reference voltage switch 356 can be either closed or open depending on whether the internal reference voltage Vref or an external reference voltage is used. A capacitor of a selected DAC unit of the upper DAC units 312 may be charged to the reference voltage. With the n line switch 356 open, a capacitor of the selected DAC unit of the upper DAC units 312 may be charged to the voltage applied to the input ports.

The n voltage input port 306 is coupled to a bottom side common node 362 that is coupled to the top side of each DAC unit of the lower DAC units 314. If the switch 310-1 is open, as shown, then the n voltage input port 306 is coupled to the top side common node 362 through a bottom pMOS transistor 382 from source to drain. The top side common node 362 is also coupled to ground 354 through a bottom nMOS transistor 384. The gate of the bottom pMOS transistor is controlled by a clock p line 386 from the CBCM logic 340 and the gate of the bottom nMOS transistor is controlled by a clock n line 388 from the CBCM logic 340. The bottom side of the capacitors of the lower DAC units 314 are coupled to inverters as drivers. By using a bottom reference voltage switch 366, each inverter may be powered by the internal reference voltage Vref. By using an P line switch 368, each inverter may be coupled to the P voltage input port 302, and powered by the voltage from Vip. The operation is the same as or similar to that described above for the upper DAC units 312.

By using the drivers, e.g., inverters, that are already coupled to each DAC unit for the clocked side of each capacitor, the test circuit requires very little additional space and components. By sharing the pMOS and nMOS control transistors with all of the upper DAC units 312 and another control transistor pair for all of the lower DAC units 314, very few additional transistors are required. The test for each capacitor is controlled by a few switches and the existing control ability of the SAR logic 320. The circuitry shown and described may be modified to suit different ADC configuration and other circuits with capacitors. As mentioned, in some examples the ADC has only a single set of DAC units, either the top or the bottom in which case either the top control transistors or the bottom control transistors may be deleted.

As shown, the measurement facility with wiring and the capabilities afforded by the CBCM logic may be integrated directly into the SAR ADC to measure the capacitances of the CDAC with high accuracy, even down to sub-femto-Farad accuracy. The measurement facility allows the capacitance to be measured by direct current measurement and knowledge of the applied voltage, referred to as the reference voltage herein, so the measurement facility is not invasive to the CDAC. It has little impact on the performance of the SAR ADC. The ADC input may be used as the reference voltage input so there is no added voltage or measurement pad required. The added devices, e.g., a few switches, are very small and so little area is required on an integrated circuit die to implement them. The drivers are reused as control elements during the measurement, further reducing the required additional area and also allowing a flexible section of all or some of the upper DAC units 312, and the lower DAC units 314 inside the CDAC.

The circuit architecture described herein may be implemented on one or more ICs, chips, chiplets, modules, interposers, packages, system printed circuit boards (PCBs), etc. The circuit architecture described herein may also be fabricated with various process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

In accordance with various aspects of the disclosure, an element, or any portion of an element, or any combination of elements may be implemented within a processing system that includes a processor and chiplets, or within a chip or chiplet alone. The circuits may be applied to use within microprocessors, microcontrollers, digital signal processors (DSPs), field programmable gate arrays (FPGAs), programmable logic devices (PLDs), state machines, gated logic, discrete hardware circuits, and other suitable hardware. The circuits may be integrated into components of an SoC. The SoC may be configured to operate as or to include a central processor, a graphics processor, a special purpose processor, a volatile memory, a non-volatile memory, an input/output controller, or any other suitable components with a processor or controller and chiplets.

Figure 4:
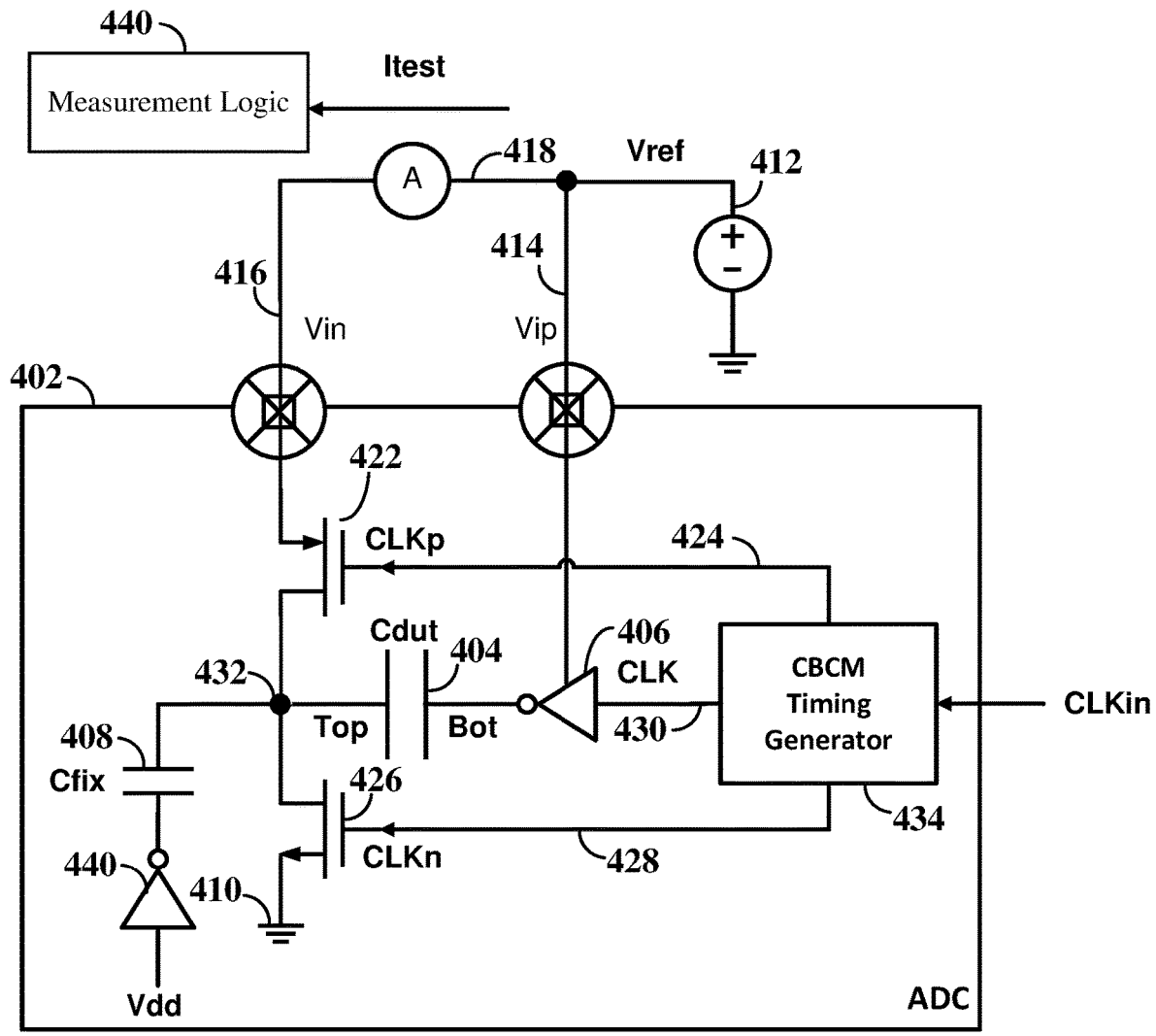
FIG. 4 is a circuit diagram of the capacitor to be tested configured within an ADC, in accordance with aspects of the disclosure.

FIG. 4 is a circuit diagram of the capacitor to be tested configured within an ADC 402. A Cdut 404 represents the capacitor that is to be tested. A Cfix 408 represents all of the other capacitors of the ADC. In the examples above, if n=8, then there are 8 capacitors in one row of parallel DAC units and Cfix 408 represents the other 7 capacitors. As the measurement moves to each capacitor of the ADC, the capacitor represented by the Cdut 404 will change to measure each capacitor of the ADC and the remaining capacitors represented by Cfix 408 will change to exclude the capacitor being newly measured. Cdut 404 is represented as having a top side and a bottom side. The bottom side is coupled to a driver 406, shown as an inverter, that represents the inverter 318 of FIG. 3. The top side is coupled to a node 432 that represents the input voltage at n voltage input port 306 of FIG. 3. As in the configuration of FIG. 3, this node is coupled to the top side of all of the capacitors in the successive lower DAC units 314. Cfix 408 represents the other capacitors which, as shown in FIG. 3 all have drivers just as the driver 406 of Cdut 404.

Figure 5:
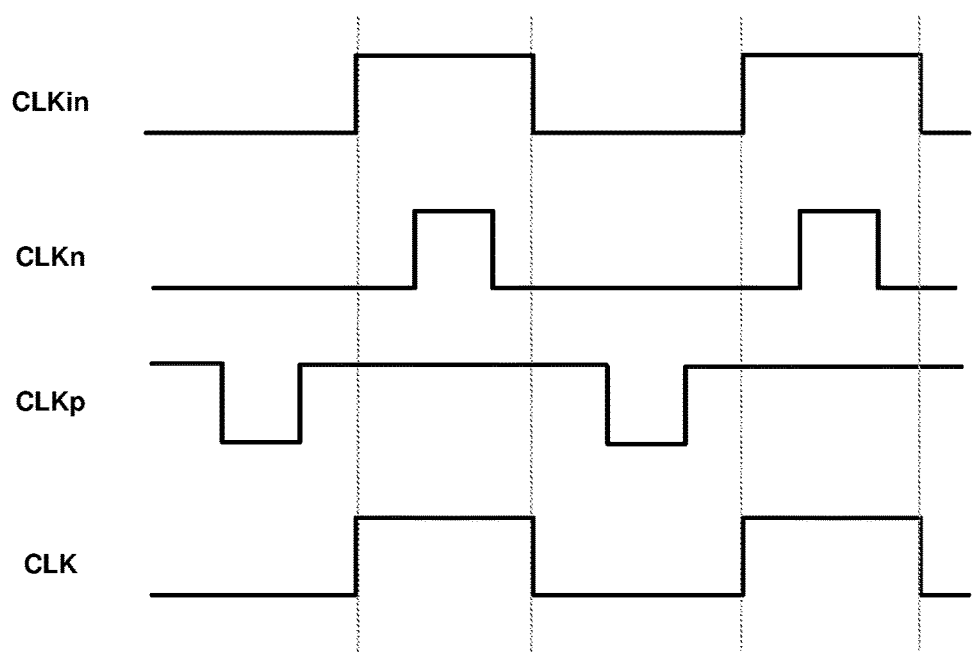
FIG. 5 is a timing diagram of clock signals for testing a capacitor, in accordance with aspects of the disclosure.

FIG. 5 is a timing diagram of clock signals for testing a capacitor. To operate a test of Cdut 404, a CBCM timing generator 434 receives a clock input and generates a first clock signal 430, a second clock signal, the p clock signal 424 and a third clock signal, the n clock signal 428. The first clock signal 430 is similar to or the same as the input first clock signal with a delay that is not significant for purposes of the present description. The first clock signal, in this example, is shown as a square wave with equally spaced negative or low periods between equally spaced positive or high periods. This is an idealized waveform but sufficient for purposes of understanding the operation of the test circuit. The n clock signal 428 is low with a positive pulse centered in and shorter than each high period of the first clock signal 430. The p clock signal 424 is high with a negative pulse centered in and shorter than each low period of the first clock signal. The signals of FIG. 5 may be generated from the clock input using frequency division logic, delay chains, or any other suitable timing logic or combination of timing logic.

After the measurements, the CBCM timing generator may be shut down until the next test. While only one capacitor is shown as being measured as the device under test (Cdut), each capacitor of Cfix also has a driver and the connections shown for the device under test may be reconfigured for a different capacitor. The switches and drivers may be reconfigured to measure a different capacitor, and in a similar way the drivers may be configured to measure multiple capacitors at the same time. In such an example Cdut 404 represents two or more selected capacitors as controlled by the CBCM timing generator 434.

During a measurement, the bottom side of Cfix 408 is coupled to ground or low (modified figure to include the inverter for Cfix). This may be an internal ground 410 or low of the ADC 402, e.g., a low period of the first clock signal. The node 432 that is coupled to the top side of Cfix 408 and of Cdut 404 may be coupled to the same internal ground 410 through a ground switch 426. The ground switch 426 is represented by a transistor with a source coupled to the node 432 and a drain coupled to the internal ground 410. The gate is coupled to the n clock signal 428. The ground switch 426 is closed, connecting the node to ground, when the n clock signal 428 is high. The node 432 is also coupled to an input voltage which is an external reference voltage 412 through a reference switch 422. The reference switch 422 is represented by a transistor with a source coupled to the external reference voltage 412 and a drain coupled to node 432. The gate is coupled to the p clock signal 424. The gate is closed connecting the node to the reference voltage when the p clock signal 424 is low. In this context, external refers to a voltage that is external to the ADC 402 but may be internal to a larger system, die, integrated circuit, or chip that includes the ADC 402.

The external reference voltage 412 is provided at an n input port 416 of the ADC 402 that is coupled through the reference switch 422 as described above. The external reference voltage 412 is also provided at a p input port 414 of the ADC 402 that is coupled to the driver 406 of the bottom side of Cdut 404. When Cdut 404 is charging to the external reference voltage 412, and when Cfix 408 is charging to the reference voltage, then there will be a current 418 across the n input port 416 and the p input port 414. This current flow may be measured in measurement logic 440 to determine the capacitance.

Figure 6:
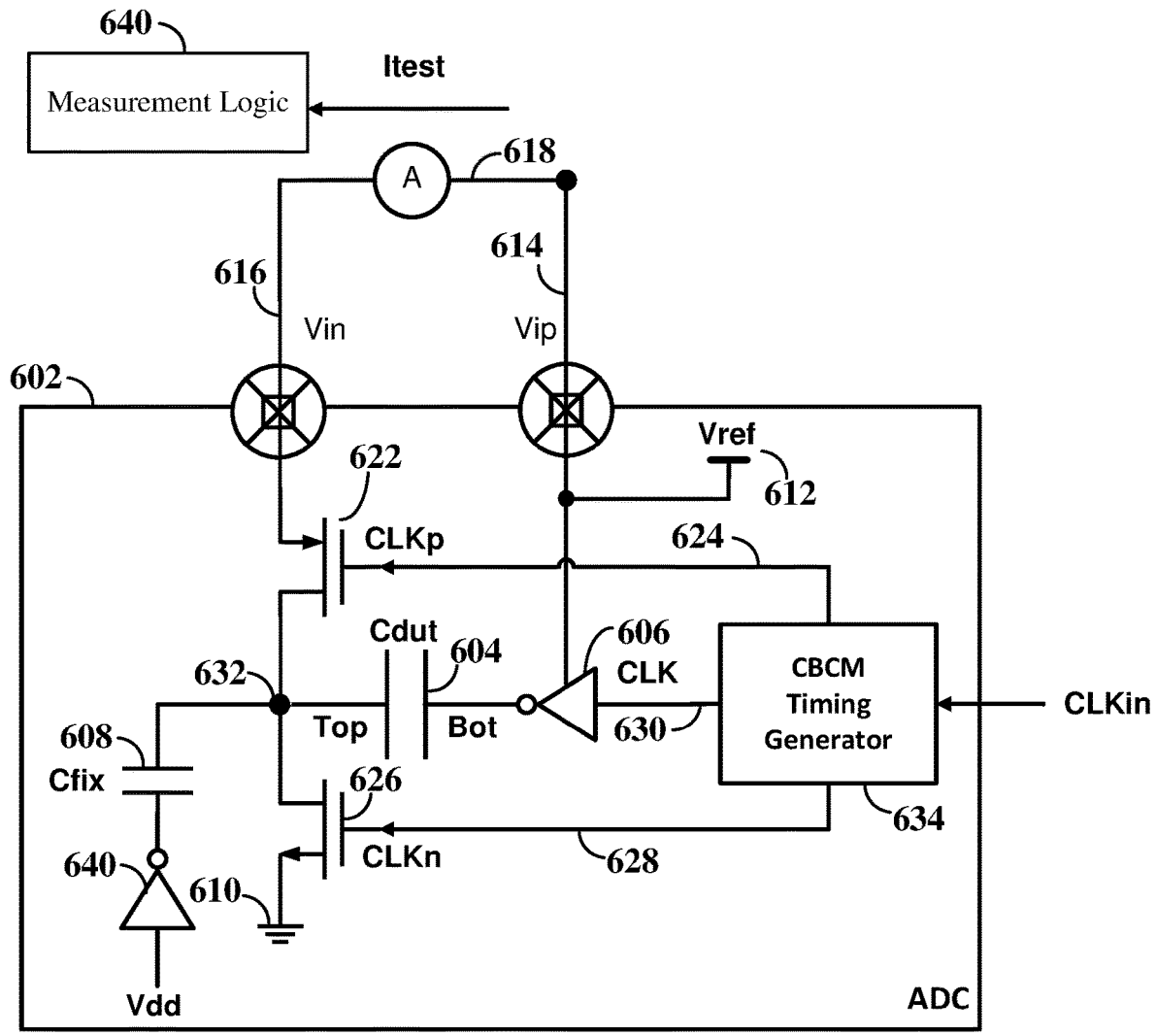
FIG. 6 is a circuit diagram of the capacitor to be tested configured within an ADC, in accordance with aspects of the disclosure.

FIG. 6 is a circuit diagram of the capacitor to be tested configured within an ADC 602. In this example the ADC 602 and test circuitry are the same except that the reference voltage 612 is internal to the ADC. The reference voltage is on an interior side of a p input port 614. The current 618 may pass through the p input port 614 externally to an n input port 616. This allows the current 618 to be measured externally in measurement logic 640. In some examples, the current is measured internally and the p input port 614 and n input port 615 are not used.

The current can be measured to measure the capacitance of Cdut. First Cdut 404 and Cfix 408 are discharged. Cdut is not selected to be driven by the clock (CLK). This occurs when the clock is low, the n clock is high and the p clock is high. Next, Cdut 404 and Cfix 408 are charged when the p clock goes low closing the reference switch 422. The current 418 that flows into Cdut 404 and Cfix 408 in parallel is measured to determine the total system capacitance. This may be represented by Equation 1:

$$ItestS = (Cfix + Cdut) \cdot Vref \cdot Fclk \quad \text{(Eq. 1)}$$

where ItestS is the average current consumed the sum of all the capacitor in the set, Cfix is the capacitance of the Cfix capacitors, Cdut is the capacitance of the device under test, Vref is the reference voltage and Fclk is the rate of change of the clock pulse.

When the p clock returns to high and the n clock goes to high then the capacitors are discharged again. After discharging and n clock goes back to low, when the clock goes low then the first clock signal 430 is asserted to the driver 406 shown here as an inverter so that the reference voltage at the p input port 414 is applied to the bottom side of Cdut 404. This charges Cdut 404. Then the p clock goes low and this charges Cfix 408 to the reference voltage but does not charge Cdut 404 which is already at the external reference voltage 412. The current 418 to charge Cfix 408 is measured to determine the capacitance of Cfix 408. This may be represented by Equation 2:

$$ItestFix = Cfix \cdot Vref \cdot Fclk \quad \text{(Eq. 2)}$$

By comparing the two currents, the capacitance of the device under test Cdut 404 may be determined as shown in Equation 3:

$$Cdut = (ItestS - ItestFix)/(Vref \cdot Fclk) \quad \text{(Eq. 3)}$$

These measurements and the determination of capacitance may be made in the measurement logic 440.

Figure 7:
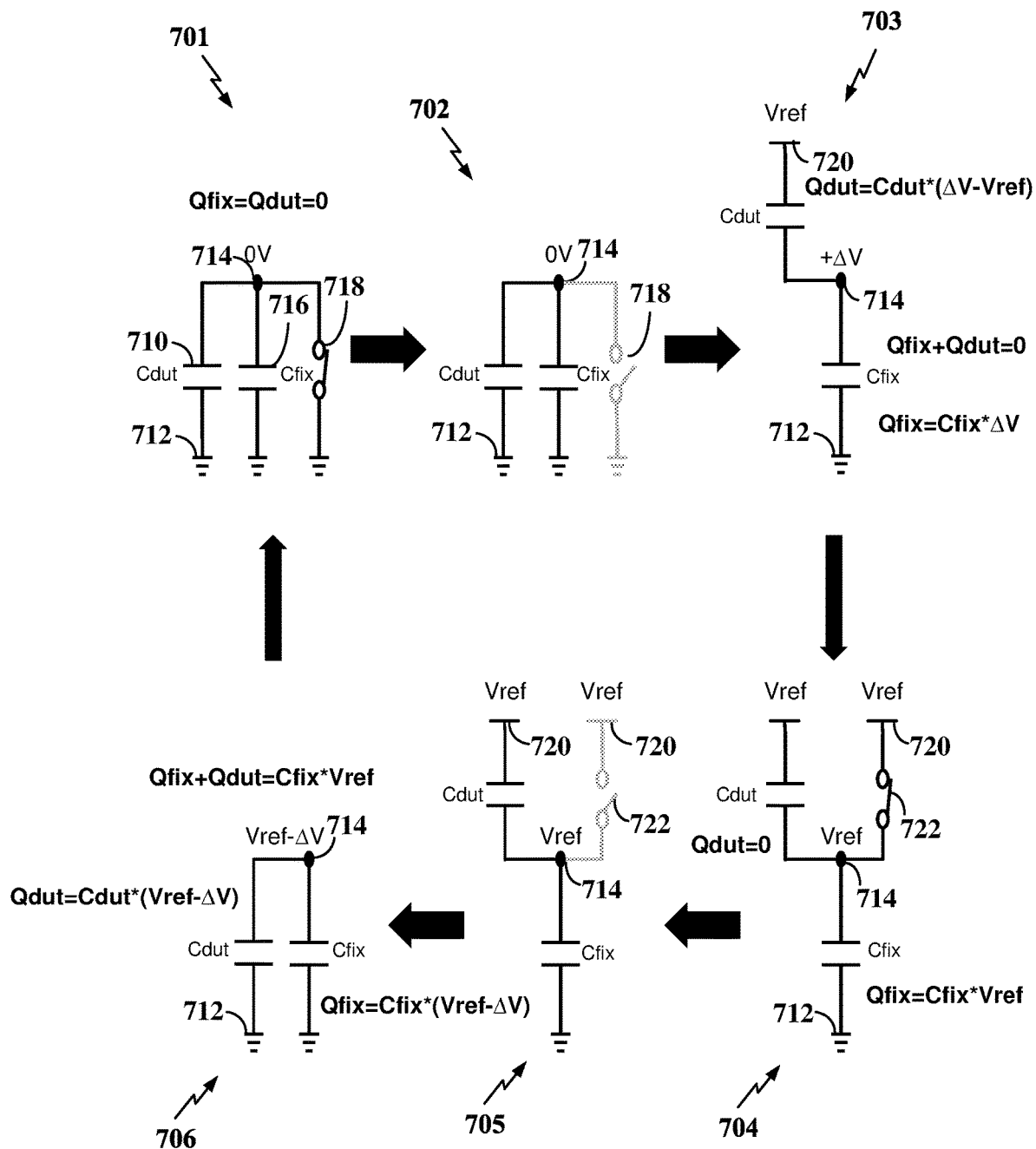
FIG. 7 is a conceptual diagram to show operations through different states of a measurement, in accordance with aspects of the disclosure.

FIG. 7 is a conceptual diagram of the operation of the measurement facility to show operations through different states of a measurement as applied to a selected capacitor. In a first state 701, Cdut 710, the device under test which may be one or more capacitors 316 of one or more DAC units of the upper DAC units 312 or the lower DAC units 314 of an ADC, e.g., the SAR ADC of FIG. 3 is coupled to ground 712 on one side, e.g., through its inverter 318, and to a node 714 on the other side. The node is also coupled to ground 712 through a switch 718. Accordingly, the voltage at the node 714 is indicated as 0V. This applies also to the charge on the two capacitors which is indicated in the drawing figure as Qfix=Qdut=0. The switch 718 may be implemented in many different ways and, in one example, corresponds to the bottom nMOS transistor 384. A Cfix 716, the remaining capacitors in a single row, e.g., the lower DAC units 314 are also coupled to the node 714 at one side and ground on the other side. The capacitors may all be grounded out by the clock input to each respective driver (not shown) of each capacitor. The clock may be high or low to render the ground connection, depending on the polarity of the system and the drivers that are coupled to the first clock signal.

In a second state 702, the ground switch 718 is open so that the circuit from the node 714 to ground 712 is removed from the operation of the capacitors. The capacitors are still grounded opposite the node 714 and then maintain the 0V state of the node 714.

In the third state 703 Cdut 710 is switched. The bottom side opposite the node 714 is switched from ground 712 to the reference voltage (Vref) or high. In the conceptual diagram, the high voltage at Vref 720 is indicated at the top of the diagram and the low voltage or ground 712 is indicated at the bottom of the diagram. Middle voltages are shown in the middle between these two. The voltages are fixed in position in the diagram and the capacitors move to show the changes in connection. The capacitor, Cdut, is charged from a ground 712, or low voltage, e.g., 0V at 714, to a higher voltage, e.g., Vref. This switch may be done by applying a high signal to the driver of the capacitor from the CBCM logic.

As shown the system charge is a combination of the charge on the device under test Qdut combined with the charge on the other capacitors Qfix. The two charge values together must zero out, e.g., Qfix+Qdut=0. For the device under test, Cdut, the charge Qdut is determined by the capacitance of Cdut factored by the change in the voltage ΔV at the node 714 and the reference voltage Vref. This may be expressed as: Qdut=Cdut*(ΔV−Vref). The charge on the other capacitors Qfix may be determined by the capacitance of the other capacitors Cfix factored by the change in the voltage ΔV at the node 714, which is the change that the other capacitors see. This may be expressed as Qfix=Cfix*ΔV. The current to provide this charge may be measured as the current to the other capacitors Cfix, indicated as Itest*Fix, above.

In the fourth state 704, the node 714 is pulled up to the reference voltage by a switch 722. The switch may represent, e.g., the bottom pMOS transistor 382 which connects the n voltage input port 306 to the reference voltage, namely Vref 720. Other switches are respectively closed or opened based on the p clock and n clock signal from the CBCM logic together with the first clock signal. In the fourth state 704, the charge Qdut on the device under test is zeroed as both sides are coupled to the reference voltage, i.e., Qdut=0. The charge Qfix on the other capacitors is now determined by the voltage at the node 714 that, in this state, is coupled to Vref 720. Cfix 716 is still coupled to ground on the bottom side as it is in all six states shown herein. The charge is therefore the capacitance, Cfix times the voltage Vref, i.e., Qfix=Cfix*Vref.

In the fifth state 705 the node 714 is disconnected from the reference voltage by the same switch 722. These are the same connections that are presented in the third state 703 but the states of the capacitors are changed after the fourth state 704 in between. The voltage at the node 714 is now Vref after having been coupled to the reference voltage. This voltage is maintained by the other capacitors Cfix for a short time.

In the sixth state 706 the bottom side of the device under test Cdut is disconnected from the reference voltage and reconnected to ground as in the first state 701. The node 714 is allowed to float. As current flows from the node 714 to ground 712 through all of the capacitors, the voltage at the node 714 may be described as Vref−ΔV, i.e., the reference voltage reduced by the change in voltage as current flows to ground. The charge on both the device under test Cdut 710 and the other capacitors Cfix 716 may be characterized in terms of this voltage, e.g., Qdut=Cdut(Vref−ΔV), Qfix=Cfix (Vref−ΔV). The total system charge may be characterized in terms of only the reference voltage, e.g., Qfix+Qdut=Cfix Vref. The current to provide this charge may be measured and used as the current to all of the capacitors indicated as ItestS, above.

Using ItestFix and ItestS, the capacitance of the device under test Cdut 710 may be determined. The system may return to the first state 701 to repeat the measurement or to perform another measurement of the same device under test or a different device under test. The states occur in a cycle from the first state 701 through each state to the sixth state 706 and back to the first state as controlled by the CBCM logic. The measurements may be performed to characterize the capacitor for design or fabrication and to perform calibration after some time in service.

Figure 8:
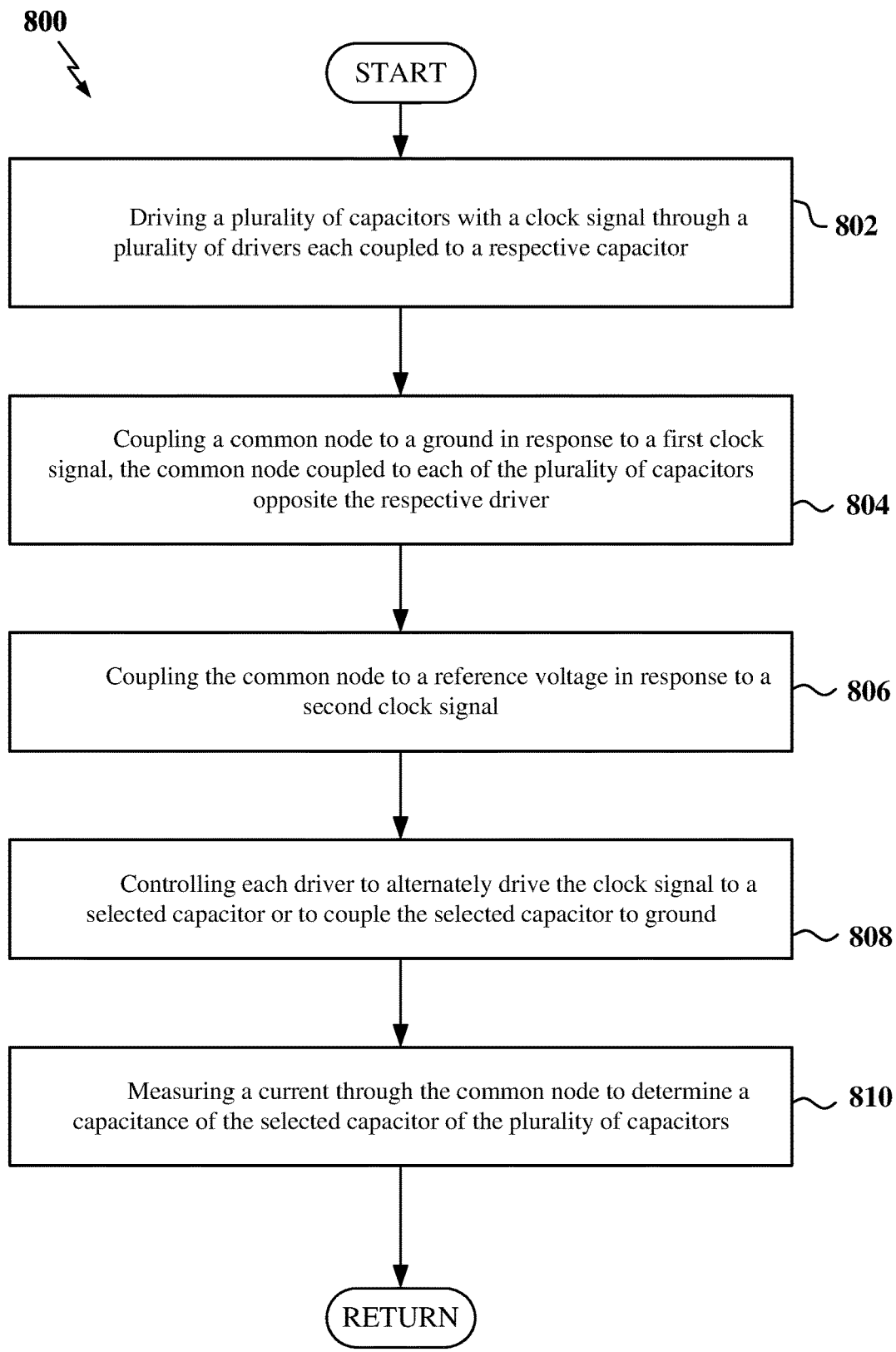
FIG. 8 is a process flow diagram illustrating an example of a method for a built-in charge-based measurement within an ADC, in accordance with aspects of the disclosure.

FIG. 8 is a process flow diagram illustrating an example of a method for a built-in charge-based measurement within an ADC or other parallel capacitor circuit. At 802, the method starts with driving a plurality of capacitors with a first clock signal through a plurality of drivers, each coupled to a respective capacitor, is performed. At 804, the method continues with coupling a common node to a ground in response to a second clock signal is performed. The common node is coupled to each of the plurality of capacitors opposite the respective driver. The method includes at 806 coupling the common node to a reference voltage in response to a third clock signal and at 808 controlling each driver to alternately drive the first clock signal to a selected capacitor or to couple the selected capacitor to ground.

The method may further include discharging the plurality of capacitors during a second clock signal level and charging the capacitors during a third clock signal level. In some examples, the method may also include charging all of the capacitors during a second clock signal level and charging all of the capacitors except the selected capacitor during a third clock signal level.

At 810, the method further includes measuring a current through the common node to determine a capacitance of the selected capacitor of the plurality of capacitors is performed. Determining a capacitance of the selected capacitor may be performed by comparing a current when the all of the capacitors charge and a current when all of the capacitors except the selected capacitor charge.

As used herein, "or" is intended to be interpreted in the inclusive sense, unless otherwise explicitly indicated. For example, "a or b" may include a only, b only, or a combination of a and b. As used herein, a phrase referring to "at least one of" or "one or more of" a list of items refers to any combination of those items, including single members. For example, "at least one of: a, b, or c" is intended to cover the examples of: a only, b only, c only, a combination of a and b, a combination of a and c, a combination of b and c, and a combination of a and b and c.

The various illustrative components, logic, logical blocks, modules, circuits, operations, and algorithm processes described in connection with the implementations disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The following provides an overview of examples of the present disclosure.

Example 1: An analog-to-digital converter (ADC) circuit, comprising a timing generator configured to receive a first clock signal, a plurality of capacitors coupled in parallel to an input voltage at a common node, a plurality of drivers each coupled to a respective capacitor opposite the common node, each driver coupled to a second clock signal to drive the capacitor with the second clock signal, a first switch coupled to the common node and configured to couple the common node to a ground in response to the second clock signal from the timing generator, a second switch coupled to the common node and configured to couple the common node to a reference voltage in response to a third clock signal from the timing generator, a successive logic circuit configured to control each driver to alternately drive the second clock signal to a selected capacitor or to couple the selected capacitor to ground, and measurement logic including a current sensor to measure a current through the common node and configured to determine a capacitance of the selected capacitor of the plurality of capacitors.

Example 2: The circuit of example 1, wherein the timing generator sets the first switch to discharge the plurality of capacitors during a second clock signal level and sets the second switch to charge the capacitors during the third clock signal level.

Example 3: The circuit of example 2, wherein the first switch comprises an n-type metal oxide semiconductor transistor having a gate coupled to the timing generator and a drain coupled to ground.

Example 4: The circuit of example 2 or 3, wherein the second switch comprises a p-type metal oxide semiconductor transistor having a gate coupled to the timing generator and a source coupled to the reference voltage.

Example 5: The circuit of any one or more of examples 1-4, wherein the successive logic circuit sets the drivers to charge all of the capacitors during a second clock signal level and sets the drivers to charge all of the capacitors except the selected capacitor during a third clock signal level.

Example 6: The circuit of example 5, wherein the measurement circuit is configured to determine a capacitance of the selected capacitor by comparing a current when all of the capacitors charge and a current when all of the capacitors except the selected capacitor charge.

Example 7: The circuit of any one or more of examples 1-6, wherein the reference voltage is an external reference voltage.

Example 8: The circuit of any one or more of examples 1-7, wherein a capacitor and a respective driver form a digital-to-analog converter unit of the ADC.

Example 9: An analog-to-digital converter (ADC) comprising a timing generator configured to receive a first clock signal, an n voltage input port, a first plurality of capacitors coupled in parallel to the n voltage input port at a first common node, a plurality of drivers each coupled to a respective capacitor opposite the first common node, each driver coupled to a second clock signal to drive the capacitor with the second clock signal, a p voltage input port, a second plurality of capacitors coupled in parallel to the p voltage input port at a second common node, a second plurality of drivers each coupled to a respective capacitor of the second plurality of capacitors opposite the second common node, each driver coupled to a third clock signal to drive the respective capacitor with the third clock signal, a first switch coupled to the first common node and configured to couple the first common node to a ground in response to the second clock signal from the timing generator, a second switch coupled to the first common node and configured to couple the first common node to a reference voltage in response to a third clock signal from the timing generator, a successive logic circuit configured to control each driver to alternately drive the second clock signal to a selected capacitor or to couple the selected capacitor to ground, and measurement logic including a current sensor to measure a current through the first common node and configured to determine a capacitance of the selected capacitor of the first plurality of capacitors.

Example 10: The ADC of example 9, wherein the timing generator sets the first switch to discharge the plurality of capacitors during a second clock signal level and sets the second switch to charge the capacitors during the third clock signal level.

Example 11: The ADC of example 9 or 10, wherein the successive logic circuit sets the drivers to charge all of the capacitors during a second clock signal level and sets the drivers to charge all of the capacitors except the selected capacitor during a third clock signal level.

Example 12: The ADC of example 11, wherein the measurement circuit is configured to determine a capacitance of the selected capacitor by comparing a current when all of the capacitors charge and a current when all of the capacitors except the selected capacitor charge.

Example 13: A method comprising driving a plurality of capacitors of an analog-to-digital converter (ADC) with a first clock signal through a plurality of drivers each coupled to a respective capacitor, coupling a common node to a ground in response to a second clock signal, the common node coupled to each of the plurality of capacitors opposite the respective driver, coupling the common node to a reference voltage in response to a third clock signal, controlling each driver to alternately drive the first clock signal to a selected capacitor or to couple the selected capacitor to ground, and measuring a current through the common node to determine a capacitance of the selected capacitor of the plurality of capacitors.

Example 14: The method of example 13, further comprising discharging the plurality of capacitors during a second clock signal level and charging the capacitors during a third clock signal level.

Example 15: The method of any one or more of examples 13-14, further comprising charging all of the capacitors during a second clock signal level and charging all of the capacitors except the selected capacitor during a third clock signal level.

Example 16: The method of example 15, wherein determining a capacitance of the selected capacitor comprises comparing a current when the all of the capacitors charge and a current when all of the capacitors except the selected capacitor charge.

Example 17: The method of any one or more of examples 13-16, further comprising setting a first switch coupled to the common node to couple the common node to the ground in response to the second clock signal from the timing generator to discharge the plurality of capacitors during the second clock signal level.

Example 18: The method of example 17, further comprising setting a second switch coupled to the common node to couple the common node to a reference voltage in response to the third clock signal from the timing generator to charge the capacitors during the third clock signal level.

Example 19: The method of any one or more of examples 13-18, wherein the controlling each driver comprises setting the drivers to charge all of the capacitors during a second clock signal level and setting the drivers to charge all of the capacitors except the selected capacitor during a third clock signal level.

Example 20: The method of example 19, wherein determining a capacitance comprises determining a capacitance of the selected capacitor by comparing a current when all of the capacitors charge and a current when all of the capacitors except the selected capacitor charge.

What is claimed is:

1. An analog-to-digital converter (ADC) circuit, comprising:
   a timing generator configured to receive a first clock signal;
   a plurality of capacitors coupled in parallel to an input voltage at a common node;
   a plurality of drivers each coupled to a respective capacitor opposite the common node, each driver coupled to a second clock signal to drive the capacitor with the second clock signal;
   a first switch coupled to the common node and configured to couple the common node to a ground in response to the second clock signal from the timing generator;
   a second switch coupled to the common node and configured to couple the common node to a reference voltage in response to a third clock signal from the timing generator;

a successive logic circuit configured to control each driver to alternately drive the second clock signal to a selected capacitor or to couple the selected capacitor to ground; and measurement logic including a current sensor to measure a current through the common node and configured to determine a capacitance of the selected capacitor of the plurality of capacitors.

2. The circuit of claim 1, wherein the timing generator sets the first switch to discharge the plurality of capacitors during a second clock signal level and sets the second switch to charge the capacitors during the third clock signal level.

3. The circuit of claim 2, wherein the first switch comprises an n-type metal oxide semiconductor transistor having a gate coupled to the timing generator and a drain coupled to ground.

4. The circuit of claim 2, wherein the second switch comprises a p-type metal oxide semiconductor transistor having a gate coupled to the timing generator and a source coupled to the reference voltage.

5. The circuit of claim 1, wherein the successive logic circuit sets the drivers to charge all of the capacitors during a second clock signal level and sets the drivers to charge all of the capacitors except the selected capacitor during a third clock signal level.

6. The circuit of claim 5, wherein the measurement circuit is configured to determine a capacitance of the selected capacitor by comparing a current when all of the capacitors charge and a current when all of the capacitors except the selected capacitor charge.

7. The circuit of claim 1, wherein the reference voltage is an external reference voltage.

8. The circuit of claim 1, wherein a capacitor and a respective driver form a digital-to-analog converter unit of the ADC.

9. An analog-to-digital converter (ADC) comprising:
a timing generator configured to receive a first clock signal;
an n voltage input port;
a first plurality of capacitors coupled in parallel to the n voltage input port at a first common node;
a plurality of drivers each coupled to a respective capacitor opposite the first common node, each driver coupled to a second clock signal to drive the capacitor with the second clock signal;
a p voltage input port;
a second plurality of capacitors coupled in parallel to the p voltage input port at a second common node;
a second plurality of drivers each coupled to a respective capacitor of the second plurality of capacitors opposite the second common node, each driver coupled to a third clock signal to drive the respective capacitor with the third clock signal;
a first switch coupled to the first common node and configured to couple the first common node to a ground in response to the second clock signal from the timing generator;
a second switch coupled to the first common node and configured to couple the first common node to a reference voltage in response to a third clock signal from the timing generator;
a successive logic circuit configured to control each driver to alternately drive the second clock signal to a selected capacitor or to couple the selected capacitor to ground; and
measurement logic including a current sensor to measure a current through the first common node and configured to determine a capacitance of the selected capacitor of the first plurality of capacitors.

10. The ADC of claim 9, wherein the timing generator sets the first switch to discharge the plurality of capacitors during a second clock signal level and sets the second switch to charge the capacitors during the third clock signal level.

11. The ADC of claim 9, wherein the successive logic circuit sets the drivers to charge all of the capacitors during a second clock signal level and sets the drivers to charge all of the capacitors except the selected capacitor during a third clock signal level.

12. The ADC of claim 11, wherein the measurement circuit is configured to determine a capacitance of the selected capacitor by comparing a current when all of the capacitors charge and a current when all of the capacitors except the selected capacitor charge.

13. A method comprising:
driving a plurality of capacitors of an analog-to-digital converter (ADC) with a first clock signal through a plurality of drivers each coupled to a respective capacitor;
coupling a common node to a ground in response to a second clock signal, the common node coupled to each of the plurality of capacitors opposite the respective driver;
coupling the common node to a reference voltage in response to a third clock signal;
controlling each driver to alternately drive the first clock signal to a selected capacitor or to couple the selected capacitor to ground; and
measuring a current through the common node to determine a capacitance of the selected capacitor of the plurality of capacitors.

14. The method of claim 13, further comprising discharging the plurality of capacitors during a second clock signal level and charging the capacitors during a third clock signal level.

15. The method of claim 13, further comprising charging all of the capacitors during a second clock signal level and charging all of the capacitors except the selected capacitor during a third clock signal level.

16. The method of claim 15, wherein determining a capacitance of the selected capacitor comprises comparing a current when the all of the capacitors charge and a current when all of the capacitors except the selected capacitor charge.

17. The method of claim 13, further comprising:
setting a first switch coupled to the common node to couple the common node to the ground in response to the second clock signal from the timing generator to discharge the plurality of capacitors during the second clock signal level.

18. The method of claim 17, further comprising:
setting a second switch coupled to the common node to couple the common node to a reference voltage in response to the third clock signal from the timing generator to charge the capacitors during the third clock signal level.

19. The method of claim 13, wherein the controlling each driver comprises setting the drivers to charge all of the capacitors during a second clock signal level and setting the drivers to charge all of the capacitors except the selected capacitor during a third clock signal level.

20. The method of claim 19, wherein determining a capacitance comprises determining a capacitance of the selected capacitor by comparing a current when all of the capacitors charge and a current when all of the capacitors except the selected capacitor charge.

* * * * *